United States Patent
Tabata et al.

(10) Patent No.: US 9,094,012 B2
(45) Date of Patent: Jul. 28, 2015

(54) DRIVING CIRCUIT AND SEMICONDUCTOR DEVICE

(71) Applicant: Mitsubishi Electric Corporation, Tokyo (JP)

(72) Inventors: Mituharu Tabata, Tokyo (JP); Yuji Miyazaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/251,703

(22) Filed: Apr. 14, 2014

(65) Prior Publication Data

US 2015/0061731 A1 Mar. 5, 2015

(30) Foreign Application Priority Data

Aug. 27, 2013 (JP) .................. 2013-175140

(51) Int. Cl.
*H03K 3/00* (2006.01)
*H03K 17/16* (2006.01)

(52) U.S. Cl.
CPC .................... *H03K 17/165* (2013.01)

(58) Field of Classification Search
CPC ................ H03K 17/04126
USPC ........................................ 327/109
See application file for complete search history.

(56) References Cited

U.S. PATENT DOCUMENTS

| 7,141,832 B2 | 11/2006 | Sugiyama et al. |
| 7,639,061 B2* | 12/2009 | Sugiyama et al. ............ 327/374 |
| 2007/0040185 A1 | 2/2007 | Sugiyama et al. |

FOREIGN PATENT DOCUMENTS

| JP | H10-248237 A | 9/1998 |
| JP | 2004-14547 A | 1/2004 |

* cited by examiner

*Primary Examiner* — Daniel Puentes
(74) *Attorney, Agent, or Firm* — Studebaker & Brackett PC

(57) ABSTRACT

A driving circuit of the present invention drives a switching element connected to a main current circuit. The driving circuit includes a driving potion applying on/off-voltage to a gate of the switching element, a common inductor disposed in an interconnection part commonly connected to the driving circuit and a source side of the switching element in a loop formed of the main current circuit and the switching element, and a capacitor connected between the gate side and the source side on the driving portion side with respect to the common inductor.

14 Claims, 11 Drawing Sheets

DRIVING CIRCUIT AND SEMICONDUCTOR DEVICE

BACKGROUND OF THE INVENTION

1. Field of the Invention

The present invention relates to a driving circuit and a semiconductor device, and more particularly, to a driving circuit that drives a switching element connected to a main current circuit of high voltage large current. For example, it relates to a driving circuit that drives a high-speed switching element, such as a MOSFET, and particularly, a switching element including a wide bandgap semiconductor. Moreover, it relates to a semiconductor device including the driving circuit.

2. Description of the Background Art

Conventionally, in a case where "a semiconductor switch group represented by a MOSFET" (hereinafter, simply referred to as a "MOSFET") such as a power MOSFET (a hybrid switch of a MOSFET and a J-FET) is used for power equipment, it is mainly used as discrete components for a switching power supply and the like. To make full use of the MOSFET having high speed performances, a switching speed has been improved.

On the other hand, in a field handling high voltage large current (generally, the rating is 300 V, 100 A, or more), an IGBT has been mainly used and the MOSFET has been rarely used. When the MOSFET is used, its high speed performances are expected. In recent times, upon developing a SiC-MOSFET, since its wide bandgap has suitability for high breakdown voltage, the MOSFET is likely to extend a range of the suitability in a field in which the IGBT has been used. If high breakdown voltage is achieved, an expansion of likelihood of voltage fluctuation simultaneously expands suitability for large current.

An IGBT is a switch that performs a combined operation of a power MOSFET and a bipolar transistor. A turn-off operation of the IGBT has characteristics as described below under general using conditions. During the turn-off operation, bipolar properties become predominant, and negative feedback properties due to a continuation of a collector current and a base width modulation generate strong negative feedback especially on condition that a voltage between a collector and an emitter increases, thereby suppressing the turn-off speed moderately. Without intentionally adjusting in particular, "trade-off between on-voltage and speed" adequate for the conventional main uses of a motor control, an UPS, a CVCF, and the like may be selected to create the state as described above.

On the other hand, the MOSFET target for this present invention does not sufficiently generate the negative feedback due to the properties of the switch itself and almost immediately shows a change in current of the switch corresponding to a control voltage. It also includes the IGBT having properties adjusted closer to a state of the MOSFET in particular and having a turn-off operation similar to that of the MOSFET.

When driving the switch employed for the high breakdown voltage large current, a driving technique different from conventional one is required. In this circumstance, the prior art regarding the MOSFET application of high breakdown voltage large current has been developed (for example, see Japanese Patent Application Laid-Open No. 2004-14547).

In a case of employing the power MOSFET for a large current of 100 A or more, particularly 300 A or more, the current is large for turn-off speed of the MOSFET, so that di/dt as the ratio increases and it is difficult to reduce stray inductance (namely, self-inductance in which an interconnection obtains unintentionally) because the interconnection needs to be increased in a geometrical size to carry the large current. A technique for intentionally reducing the switching speed of the MOSFET is required for reasonable costs.

As a method to reduce the switching speed of the MOSFET, a driving current is basically reduced by increasing a gate resistance (in other words, a charging speed of an input capacitance of the MOSFET is reduced) and a charging voltage increase speed of an input capacitance of the MOSFET is reduced by increasing the input capacitance. However, the application of large current has a constraint on heat dissipation capacity of a heat loss by a switching loss, and in terms of saving energy, it is required to minimize the loss. Thus, such simple method is not sufficient.

In the application of large current, a load for switching is generally inductive, so that in the turn-off switching, a change occurs in current after a change in voltage is almost completed. Since di/dt concerns a current change speed in a latter half of the turn-off switching, the current change speed in the latter half needs to be suppressed without sacrificing a voltage change speed in a first half of the turn-off switching. However, this timing changes under various conditions, and thus it is not easy to predict the timing from indirect parameters.

In this case, the method, which intentionally increases an inductance of an interconnection shared between the main current circuit connected to the source terminal and the driving circuit (hereinafter, referred to as a common inductance) to add the negative feedback, is known. However, to decrease influences of the switching electromagnetic field on the driving circuit in a large current switching, it is preferable that the driving circuit is disposed in a distance from the MOSFET. Under constraints of the present interconnection and heat dissipation technique, an inductance of an interconnection from the driving circuit to the MOSFET (hereinafter, referred to as "a driving inductance") has a value which cannot be ignored for the inductance value appropriate for the negative feedback in the application of large current, and the driving inductance has a tendency to keep passing the driving current which interferes the negative feedback, thereby resulting in insufficient effects.

SUMMARY OF THE INVENTION

It is an object of the present invention to provide a driving circuit capable of reducing di/dt in a turn-off switching operation of a MOSFET with minimum effect on the other operations.

A driving circuit of the present invention drives a switching element connected to a main current circuit. The driving circuit includes a driving potion applying on/off-voltage to a gate of the switching element, a common inductor disposed in an interconnection part commonly connected to the driving circuit and a source side of the switching element in a loop formed of the main current circuit and the switching element, and a capacitor connected between the gate side and the source side on the driving portion side with respect to the common inductor.

According to a driving circuit of the present invention, when turning off a switching element, a driving inductance is supplied with a current discharged by a capacitor, and thus a negative feedback voltage of a common inductor is effectively applied between a gate and a source of the switching element. Thus, when turning off the switching element, a change in time of the discharging current of an input capacitance of the switching element can be reduced. To reduce di/dt, increasing a gate resistance and decreasing the driving inductance are unnecessary, thereby having no effect on an operation except for turning off the switching element.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Configuration

Figure 1:
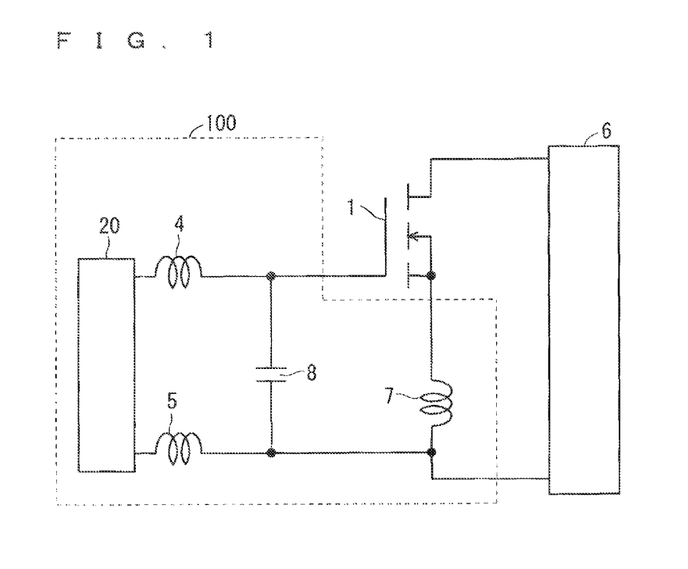
FIG. 1 is a diagram showing a configuration of a driving circuit according to a first preferred embodiment.

FIG. 1 shows a configuration of a driving circuit 100 in the present preferred embodiment. The driving circuit 100 drives a switching element 1 connected to a main current circuit 6. In the present preferred embodiment, the switching element 1 is, for example, a MOSFET.

The driving circuit 100 includes a driving portion 20 applying voltage to a gate of the switching element 1 for turning on/off the switching element 1. The driving circuit 100 further includes a common inductor 7 and a capacitor 8. The common inductor 7 is disposed in an interconnection part commonly connected to the driving circuit 100 and a source side of the switching element 1 in a loop formed of the main current circuit 6 and the switching element 1. The capacitor 8 is connected between the gate side and the source side of the switching element 1 on the driving portion 20 side with respect to the common inductor 7.

Driving inductances 4 and 5 are self-inductances of an interconnection from the driving portion 20 to the MOSFET.

<Operation>

In general, to reduce the turn-off speed of the MOSFET, a discharging current of an input capacitance 11 of the MOS-FET needs to be reduced. Consequently, in the present preferred embodiment, the common inductor 7 is provided as a negative feedback component. During the turn-off operation, the drain current is on the decrease, so that the voltage is generated by di/dt in the common inductor 7, to thereby reduce the discharging current of the input capacitance 11 by changing the source potential to the negative side.

Without the capacitor 8, the driving inductances 4 and 5 keep passing the discharging current, thereby preventing the discharging current of the input capacitance 11 from being reduced. Thus, in the present preferred embodiment, the capacitor 8 is connected to serve as a temporary bypass circuit for the current of the driving inductances 4 and 5. The driving inductances 4 and 5 passing the discharging current of the capacitor 8 and the capacitance between the gate and the source until immediately before starting the turn-off do not need to change the current value because the discharging current flows from the capacitor 8 into the driving inductances 4 and 5. Thus, the voltage generated in the common inductor 7 ($V_L$) is not interrupted to transfer between the gate and the source. Moreover, after no negative feedback is needed, the capacitor 8 discharges to rapidly charge between the gate and the source, thereby preventing a delay caused by a decrease in the on-voltage.

Figure 2:
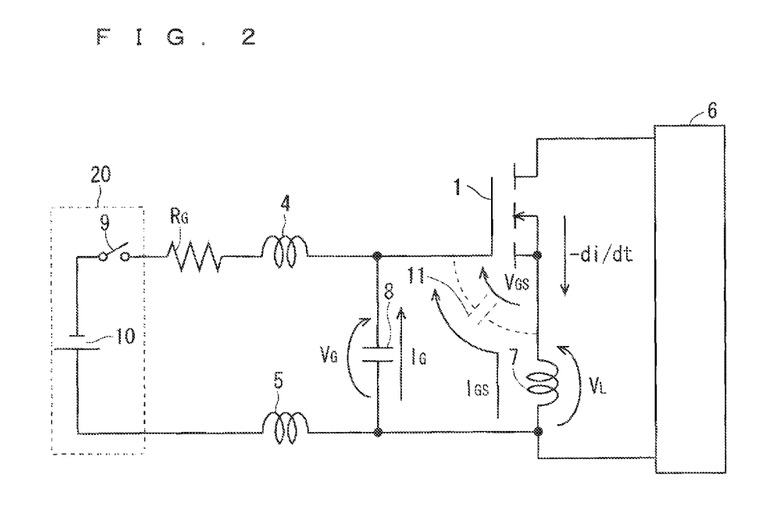
FIG. 2 is a diagram showing an operation of the driving circuit according to the first preferred embodiment.

With reference to FIG. 2, the operation will be described in more detail. For example, the switching element 1 (MOSFET) has a rated voltage of 1200 V and a rated current of 1000 A, and an abnormal current of 2000 A flows during the operation in a direct current voltage of 600 V, which needs to be interrupted safely.

The switching element 1 is a means for opening and closing a current circuit in a loop formed of the main current circuit 6 and the common inductor 7. This loop has an inductance component. In a case where the main current circuit has an inductance ($L_S$) of 50 nH, if a turn-off surge voltage ($-L_S \times di/dt$) needs to be set to a peak of 1100 V or less, it is required to be ($L_S \times di/dt$)≤(1100 V−600 V=500 V). When $L_S$=50 nH, di/dt needs to be set to 10 A/ns or less.

In a case where a driving voltage source has a voltage of −10 V and a gate resistance $R_G$ of 3Ω is driven, if a threshold voltage ($V_{GE}$) (on-voltage) has around 5 V, the driving current of approximately (5−(−10)) V/3 Ω=5 A flows into the gate resistance $R_G$ while generating di/dt. In this state, to reduce di/dt=50 A/ns to 10 A/ns, a charging current flown into the input capacitance 11 of the MOSFET needs to be reduced to approximately one-fifth thereof which is 1 A. This requires the voltage applied to the gate resistance $R_G$ to be one-fifth thereof. In other words, this requires the negative feedback of 12 V which is four-fifth of (5−(−10))=15 V to be provided.

First, a case where the capacitor 8 is not connected will be described. If the driving circuit 100 is disposed in a distance of 100 mm from the MOSFET, it becomes more difficult to achieve that the driving inductances 4 and 5 are set to 30 nH or less. In a case of reducing from 5 A flowing into an inductance of 30 nH to 1 A before di/dt is sufficiently increased, a current is required for reducing within about the first 10% of 2000 [A]/110 [A/ns]=200 ns, namely within 20 ns. Thus, it requires to apply 30 [nH]×(5−1 [A])/20 ns=6 [V] to the driving inductance.

The total of 12+6=18 V needs to be obtained as a negative feedback voltage, and damped oscillation is generated at the voltage peak corresponding to the negative feedback voltage after the end of di/dt. When driving the gate with −10 V, the voltage applied between the gate and the emitter is within the range from −28 V to +8 V. The value on the negative side has a problem regarding a gate resistance and the value on the positive side causes a malfunction.

Therefore, on the conditions as described above, only the negative feedback by the common inductor 7 cannot reduce di/dt sufficient enough to set the surge voltage of 1100 V or less. Consequently, it is necessary to increase the gate resistance $R_G$, the switching operation except di/dt period is influenced.

In the present invention, the capacitor 8 is added to the driving circuit 100. This addition makes the negative feedback voltage for reducing the current of the gate resistance $R_G$ unnecessary. On the other hand, 5−1=4A continues to be absorbed in the period of 200 ns, which makes the amount of charge 800 nC, and if the capacity of the capacitor 8 is 500 nF, the negative feedback of 800 nC/500 nF=1.6 V is achieved for the driving inductances 4 and 5.

As a result, the necessary voltage for the negative feedback voltage is 1.6 V, whereby an ideal effect can be obtained with a few negative feedback. Moreover, as the driving inductances 4 and 5 keep a current of 5 A passing, values of driving inductances 4 and 5 are unnecessary to be reduced. Thus, the amount of the negative feedback is unnecessary to be increased even if the driving inductances 4 and 5 have the values as large as possible, whereby the driving inductances 4 and 5 causing the negative feedback operation have no maximum limit.

FIG. 2 shows the gate resistance $R_G$ as a driving current limiting means. However, any means for limiting the driving current can obtain the similar effect. For example, even in a case of a constant-current drive, the use of the present invention can obtain the similar effect as in the case of the gate resistance.

<Effects>

The driving circuit 100 in the present preferred embodiment drives the switching element 1 connected to the main current circuit 6, and includes the driving portion 20 applying the on/off-voltage to the gate of the switching element 1, the common inductor 7 disposed in an interconnection part commonly connected to the driving circuit 100 and the source side of the switching element 1 in the loop formed of the main current circuit 6 and the switching element 1, and the capacitor 8 connected between the gate side and the source side on the driving portion 20 side with respect to the common inductor 7.

Therefore, when turning off the switching element 1, the driving inductances 4 and 5 are supplied with the current discharged by the capacitor 8, and thus the negative feedback voltage of the common inductor 7 is effectively applied between the gate and the source of the switching element 1. Thus, when turning off the switching element 1, a change in time of the discharging current of the input capacitance 11 of the switching element 1 can be reduced. In the present preferred embodiment, increasing the gate resistance and decreasing the driving inductances 4 and 5 are unnecessary, so that without having an effect on the operations except for turning off the switching element 1, di/dt can be reduced during turn-off.

Furthermore, a semiconductor device in the present preferred embodiment includes the switching element 1 and the driving circuit 100. Therefore, according to the present preferred embodiment, a semiconductor device serving as a switching device which reduces switching speed without increasing an energy loss can be obtained.

Second Preferred Embodiment

Configuration

Figure 3:
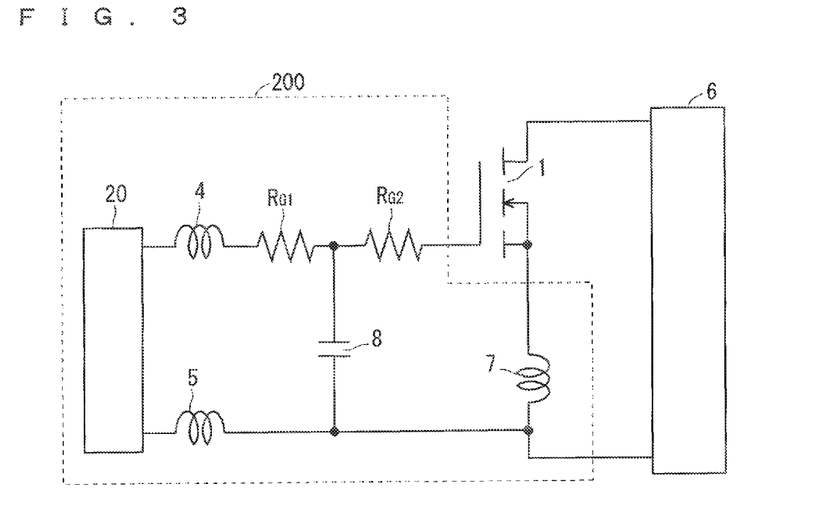
FIG. 3 is a diagram showing a configuration of a driving circuit according to a second preferred embodiment.

FIG. 3 shows a configuration of a driving circuit 200 in the present preferred embodiment. In the present preferred embodiment, a plurality of driving current limiting portions connected in series are provided on a gate side of a switching element 1. As shown in FIG. 2, the driving current limiting portions are, for example, gate resistances $R_{G1}$ and $R_{G2}$. An end of a capacitor 8 is connected between the gate resistances $R_{G1}$ and $R_{G2}$.

<Operation>

A negative feedback voltage corresponding to driving inductances 4 and 5 is 1.6 V similarly to the first preferred embodiment. On the other hand, to make a discharging current of an input capacitance 11 one-fifth thereof, the voltage applied to the gate resistance $R_{G2}$ is made one-fifth. The necessary negative feedback voltage corresponding to the gate resistance is 12 [V]×$R_{G2}$/($R_{G2}$+$R_{G1}$)=12 [V]×1/(1+$R_{G1}$/$R_{G2}$), and the ratio of the gate resistance $R_{G1}$ to the gate resistance $R_{G2}$ can adjust the amount of the negative feedback. Since it is often difficult to adjust a value of a common inductor 7, adjusting the ratio of the gate resistance $R_{G1}$ to the gate resistance $R_{G2}$ facilitates fine adjustments of the negative feedback voltage.

Figure 4:
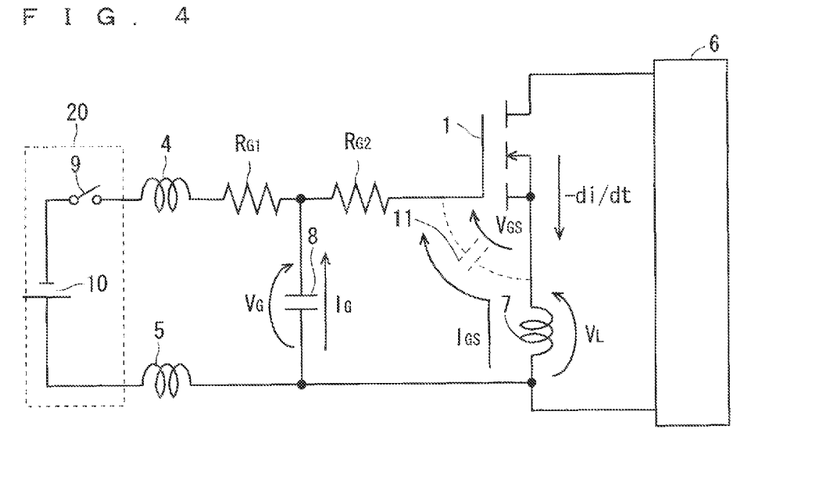
FIG. 4 is a diagram showing an operation of the driving circuit according to the second preferred embodiment.
Figure 5:
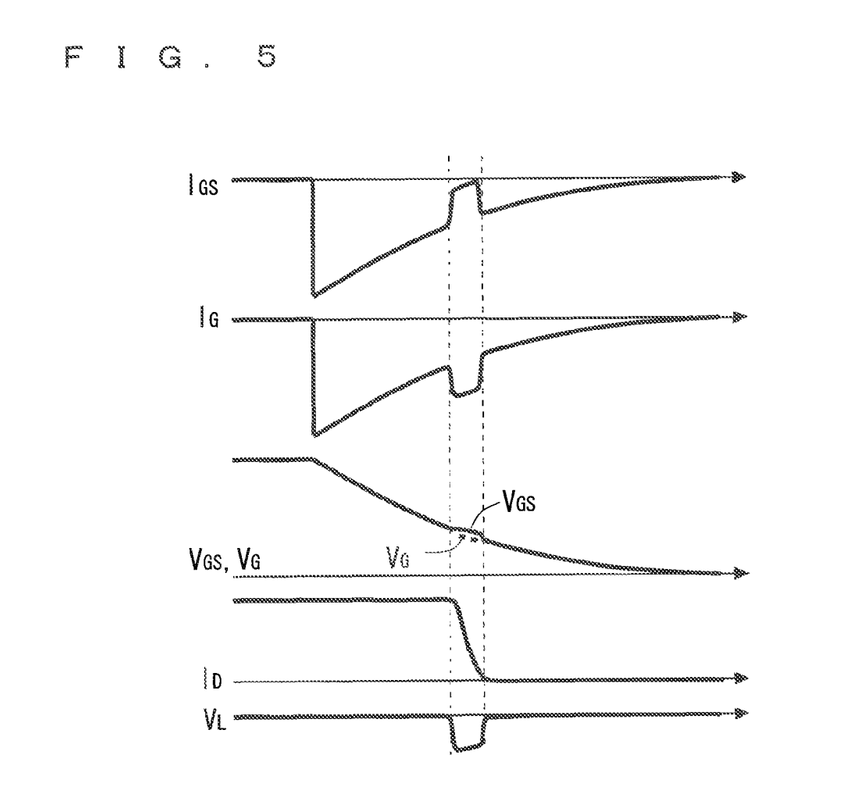
FIG. 5 is a diagram showing an operation waveform of the driving circuit according to the second preferred embodiment.

With reference to FIGS. 4 and 5, an operation of the driving circuit 200 will be described. FIG. 5 is an operation waveform of the driving circuit 200. The switching element 1 (MOSFET) turns on in an initial state, and a voltage $V_{GS}$ sufficient for turning it on is charged in the input capacitance 11. The capacitor 8 is also charged to the same voltage.

A virtual switch 9 turns on for a turn-off drive, and a driving voltage source 10 starts to discharge the voltage charged in the input capacitance 11 and the capacitor 8 through the gate resistances $R_{G1}$ and $R_{G2}$.

The discharge of the input capacitance 11 decreases $V_{GS}$ and in the vicinity of a threshold voltage, $I_D$ starts to decrease correspondingly to $V_{GS}$. As the amount of change in $I_D$, −di/dt flows into the common inductor 7, and a voltage $V_L$ is generated at two ends of the common inductor 7 in a negative direction. The voltage $V_L$ changes a source potential of the MOSFET to the negative side, and the discharging current $I_{GS}$ of the input capacitance 11 is decreased to the value in which a lowering speed of $V_{GS}$ balances with $L_S$×di/dt.

The current flowing into the driving inductances 4 and 5 cannot be changed rapidly, so that the amount of reduction of $I_{GS}$ is discharged from the capacitor 8 and $I_G$ increases. Consequently, $V_G$ decreases and the amount of decrease is adjusted to be balanced between the lowering speed of $V_{GS}$ and $L_S$×di/dt.

<Effects>

The driving circuit 200 in the present preferred embodiment is characterized as follows. It further includes the plurality of driving current limiting portions (namely, the gate resistances $R_{G1}$ and $R_{G2}$) on the gate side of the switching element 1. The plurality of driving current limiting portions are connected in series. One end of the capacitor 8 is connected between the plurality of driving current limiting portions.

Therefore, the ratio of the gate resistance $R_{G1}$ to the gate resistance $R_{G2}$ can adjust the amount of the negative feedback. Since it is often difficult to adjust a value of a common inductor 7, adjusting the ratio of the gate resistance $R_{G1}$ to the gate resistance $R_{G2}$ facilitates fine adjustments of the negative feedback voltage.

Third Preferred Embodiment

Configuration

Figure 6:
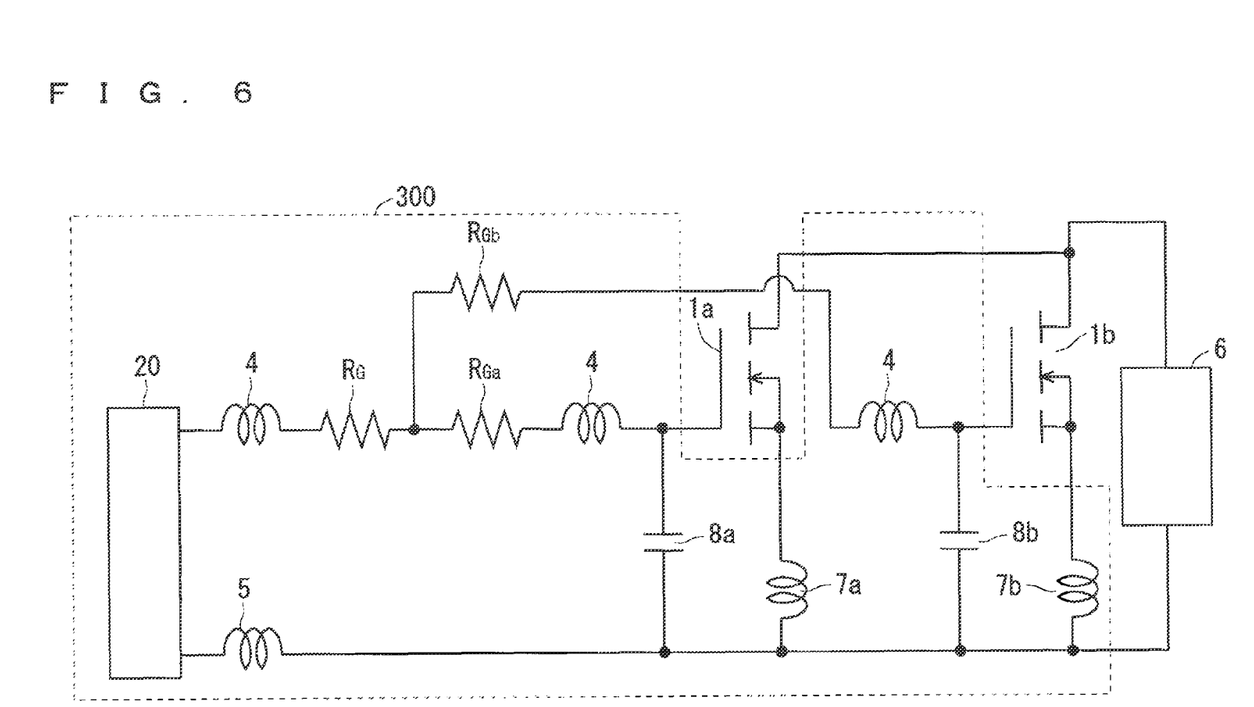
FIG. 6 is a diagram showing a configuration of a driving circuit according to a third preferred embodiment.

FIG. 6 shows a configuration of a driving circuit 300 in the present preferred embodiment. In the present preferred embodiment, two switching elements 1a and 1b (MOSFETs) are connected in parallel to a main current circuit 6.

Similar to the first preferred embodiment, common inductors 7a and 7b are provided on a source side of the switching elements 1a and 1b, respectively. A capacitor 8a is connected between the gate side and the source side of the switching element 1a on the side closer to a driving portion 20 than the common inductor 7a with respect to the switching element 1a. Similarly, a capacitor 8b is connected between the gate side and the source side of the switching element 1b on the side closer to the driving portion 20 than the common inductor 7b with respect to the switching element 1b. An interconnection has the driving inductances 4 and 5.

<Operation>

In a case where the switching element 1a switches faster than the switching element 1b, the switching element 1a has a di/dt greater than that of the switching element 1b. The voltage generated in the common inductor 7a is greater than that generated in the common inductor 7b.

As a result, a turn-on speed of the switching element 1a is suppressed more greatly, and the switching speed of the switching element 1a and the switching element 1b is automatically corrected so as to match with each other. The driving inductances 4 interfere with this operation, and particularly, the effect is exceedingly limiting to the MOSFET having a large amount of current, whereby achieving a parallel connection is a serious matter. As in the present preferred embodiment, the capacitors 8a and 8b are provided to greatly reduce the interference, and thus even in the application of large current to the switching element 1a and 1b, a parallel balance is strongly averaged similar to a circuit having a small current.

In a case of a multistage parallel connection in the present preferred embodiment (in other words, in a case where some groups are connected in parallel and each group includes switching elements connected in parallel), each level (stage) may be applicable. Each level obtains effects as described above.

<Effects>

The driving circuit 300 in the present preferred embodiment is characterized as follows. The plurality of switching elements 1a and 1b are connected in parallel to the main current circuit 6. The plurality of switching elements 1a and 1b include the common inductors 7a and 7b, and the capacitors 8a and 8b, respectively.

Therefore, providing the capacitors 8a and 8b enables to suppress effects of the driving inductances 4. Thus, the switching speed of the switching elements 1a and 1b connected in parallel can be averaged.

Fourth Preferred Embodiment

Figure 7:
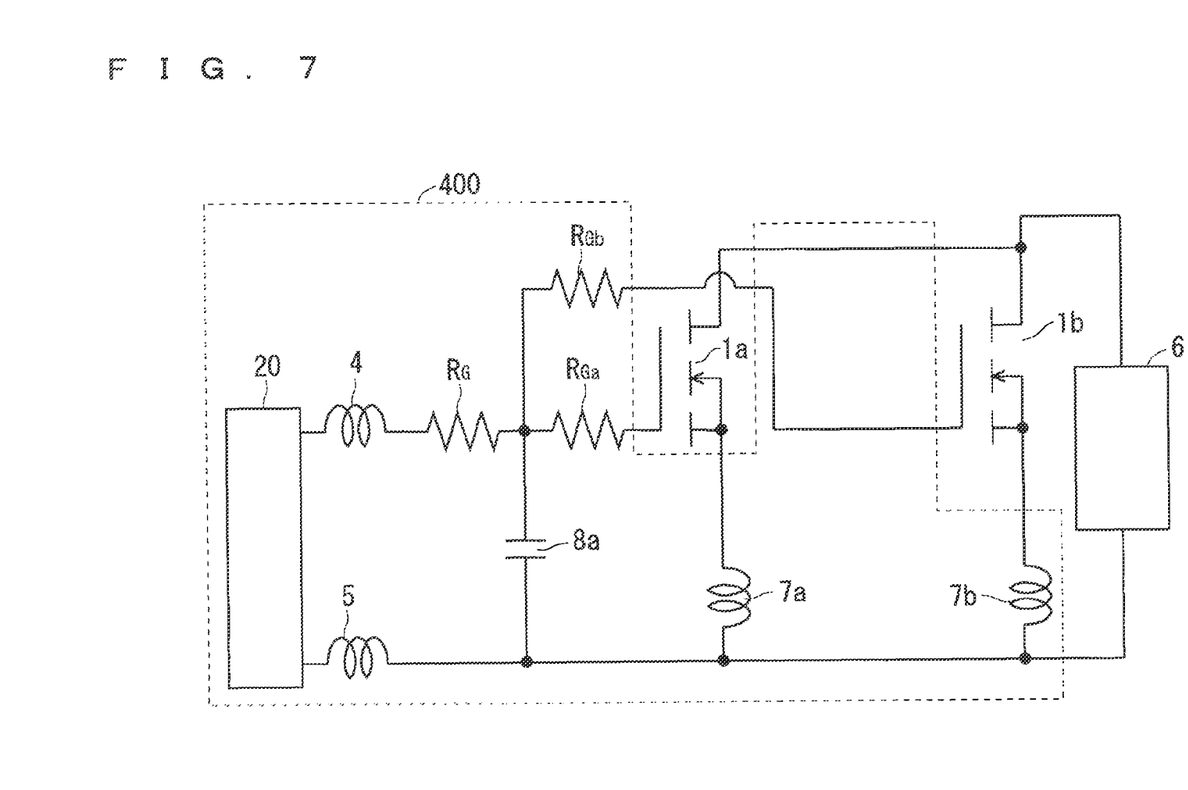
FIG. 7 is a diagram showing a configuration of a driving circuit according to a fourth preferred embodiment.

FIG. 7 shows a configuration of a driving circuit 400 in the present preferred embodiment. The driving circuit 400 in the present preferred embodiment has a configuration which is the driving circuit 300 (FIG. 6) of the third preferred embodiment without the capacitor 8b. The other configuration is similar to that in the third preferred embodiment, and the descriptions will be omitted.

In the third preferred embodiment, the capacitors 8a and 8b are connected to the switching elements 1a and 1b (MOSFETs), respectively. The effects similar to that in the third preferred embodiment can be obtained by disposing the capacitor 8a without the capacitor 8b as long as it is connected closer to a driving portion 20 side than gate resistances $R_{Ga}$ and $R_{Gb}$ as a driving current limiting means. In this case, the gate resistance $R_G$ as a driving current limiting means is not required, and with the gate resistance $R_G$, the effects as described in the second preferred embodiment can be obtained.

In a case where a multistage parallel connection (in other words, in a case where some groups are connected in parallel and each group includes switching elements connected in parallel) in the driving circuit 400 of the present preferred embodiment, each level (stage) may be applicable.

<Effects>

The driving circuit 400 in the present preferred embodiment is characterized in that it includes at least the capacitor 8a among the plurality of capacitors 8a and 8b that is disposed closest to the driving portion 20 instead of including the plurality of switching elements 1a and 1b for the capacitors 8a and 8b, respectively.

Therefore, although the capacitor 8b is omitted, the effect similar to that in the third preferred embodiment (driving circuit 300) can be obtained with the capacitor 8a disposed closest to the driving portion 20 side. Thus, the number of capacitors can be reduced.

Fifth Preferred Embodiment

Figure 8:
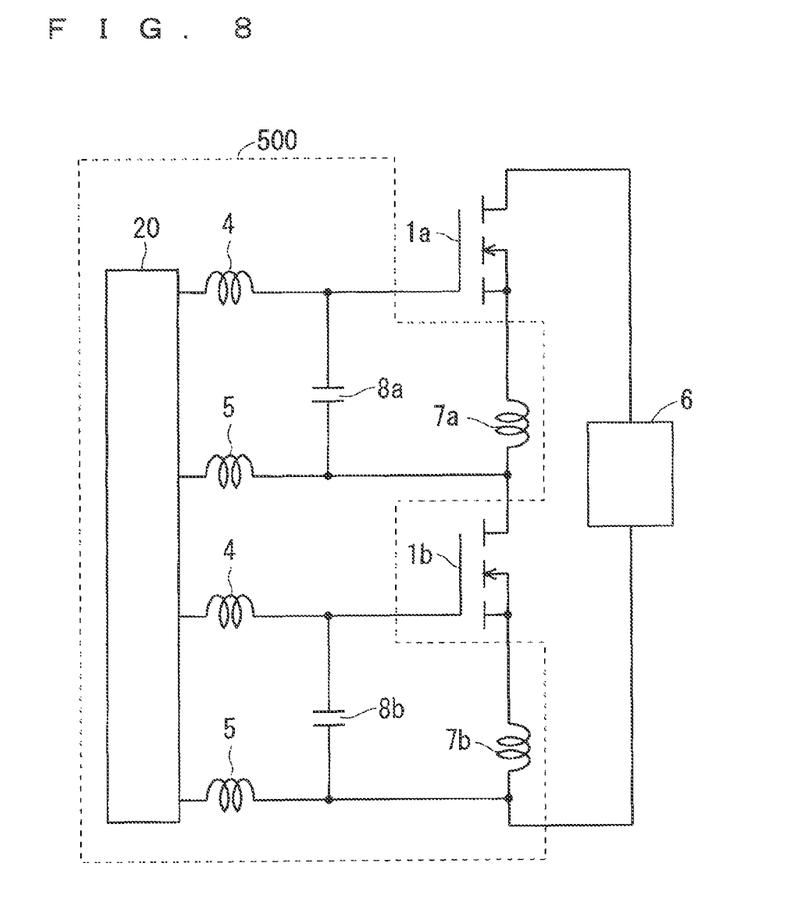
FIG. 8 is a diagram showing a configuration of a driving circuit according to a fifth preferred embodiment.

FIG. 8 shows a configuration of a driving circuit 500 of the present preferred embodiment. In the present preferred embodiment, two switching elements 1a and 1b are connected in series relative to a main current circuit 6. The switching elements 1a and 1b connected in series are each connected to a driving circuit similar to the driving circuit 100 in the first preferred embodiment (FIG. 1).

The driving circuit 100 of the first preferred embodiment (FIG. 1) accelerates the tendency in which di/dt passing through the common inductor 7 is stabilized at a certain value. On the other hand, a current $I_D$ is not generated and diminished, and the current value circulating a circuit is constant anywhere as long as the circuit is not divided. Thus, di/dt in the circuit is also constant.

From the perspective as described above, inductances in a circulating circuit are provided as the common inductors 7a and 7b, allowing for not only control of di/dt but also synchronization with the switching speed of the plurality of switching elements (MOSFETs) connected in series.

A circuit configuration of the driving circuit 500 in the present preferred embodiment has similarities to the third preferred embodiment (driving circuit 300), and in the driving circuit 500, di/dt values of the switching elements 1a and 1b (MOSFETs) are not averaged with each other, and di/dt values of the switching elements are operated to be compulsorily synchronized with di/dt of any one of the switching elements having the most stability tendency.

Figure 9:
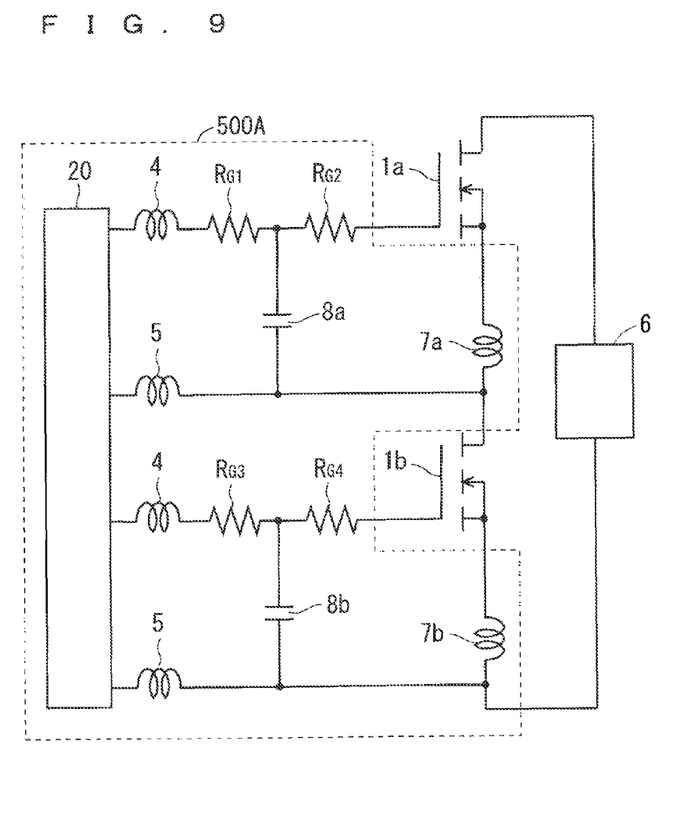
FIG. 9 is a diagram showing a modification of the driving circuit according to the fifth preferred embodiment.

FIG. 9 shows a driving circuit 500 A as a modification of the driving circuit 500. Similar to the second preferred embodiment (driving circuit 200), divided gate resistances $R_{G1}$, $R_{G2}$, $R_{G3}$, and $R_{G4}$ are provided in an individual driving circuit, so that the amount of the negative feedback of the switching elements 1a and 1b can be adjusted individually. For example, the switching element 1a has the amount of the negative feedback greater than that of the switching element 1b, which enables to arbitrary select and set a leading switching element, thereby easily adjusting the whole series circuit.

<Effects>

In the driving circuit 500 of the present preferred embodiment, the plurality of switching elements 1a and 1b are connected in series relative to the main current circuit 6, and the driving circuit 500 includes the driving circuit 100 for each of the switching elements 1a and 1b with.

Therefore, the switching of the switching elements 1a and 1b connected in series can be synchronized.

Sixth Preferred Embodiment

Configuration

Figure 10:
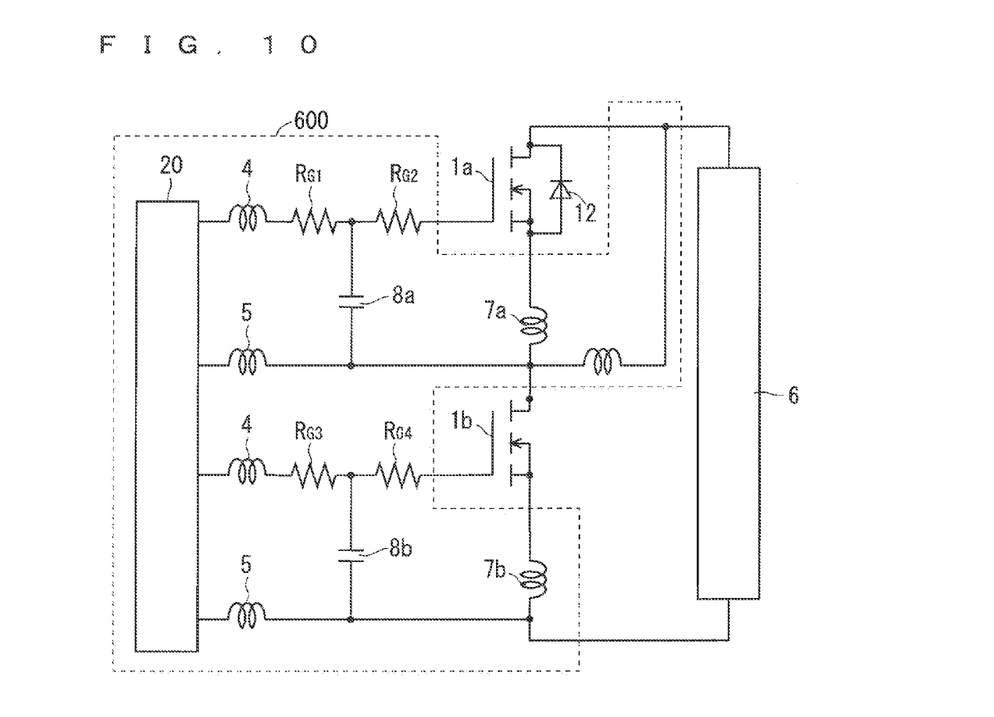
FIG. 10 is a diagram showing a configuration of a driving circuit according to a sixth preferred embodiment.

FIG. 10 shows a configuration of a driving circuit 600 in the present preferred embodiment. The driving circuit 600 in the present preferred embodiment differs from the driving circuit 500 of the fifth preferred embodiment (FIG. 8) in that the driving circuit 600 forms a bridge circuit together with the switching elements 1a and 1b.

<Operation>

In a case of the bride circuit which is different from the fifth preferred embodiment, the on-period of each switching element 1a and 1b (MOSFET) connected in series is not necessarily synchronized, and an operation of independent switching timing is required in most cases.

Figure 11A:
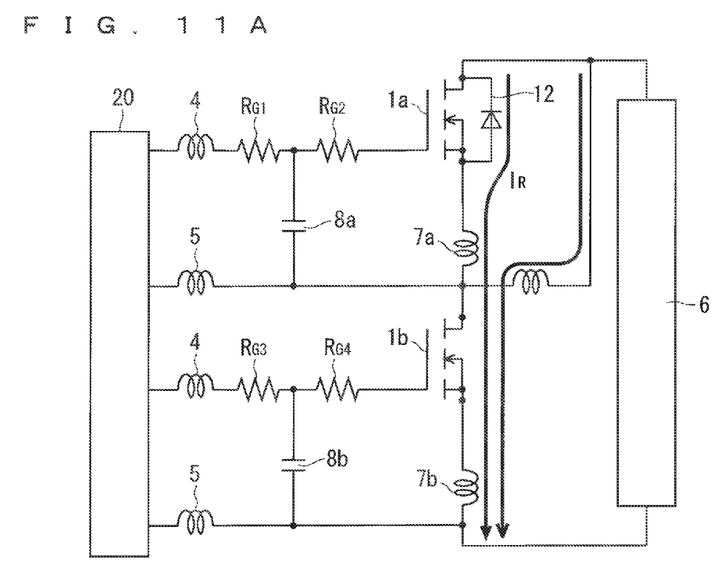
FIGS. 11A and 11B are diagrams showing an operation of the driving circuit according to the sixth preferred embodiment.

With reference to FIG. 11A, an operation in a case where the switching element 1b turns on while an opposite arm is in off-state (in other words, the switching element 1a is in off-state) and a current flows into a diode 12 of the opposite arm or a parasitic diode of the MOSFET (switching element 1a) will be described.

The diode 12 cannot turn off instantly, so that a reverse current $I_R$ referred to as a recovery current immediately flows into the diode 12. When the recovery current $I_R$ is on the increase, the voltage generated in a common inductor 7a increases a reverse bias of $V_{GS}$ of the switching element 1a and operates on the safe side. When converging the recovery current $I_R$, di/dt in an opposite direction turns on the switching element 1a for a moment, thereby having an effect of reducing di/dt. This reduces hard recovery of the diode 12, suppresses a voltage surge caused by di/dt when converging the recovery current $I_R$, and suppresses voltage vibration caused by reaction against the voltage surge.

Since decreasing di/dt when converging the recovery current gives an adverse effect on loss characteristics of the MOSFET, the parasitic diode of the switching element 1a has constraints. Even if the diode 12 is provided externally, there are limits on compatibility of di/dt when decreasing recovery charge and converging the recovery current. Therefore, when the amount of the negative feedback is properly adjusted, characteristics of reducing di/dt in the whole circuit by the operation of the MOSFET are an advantage.

Figure 11B:
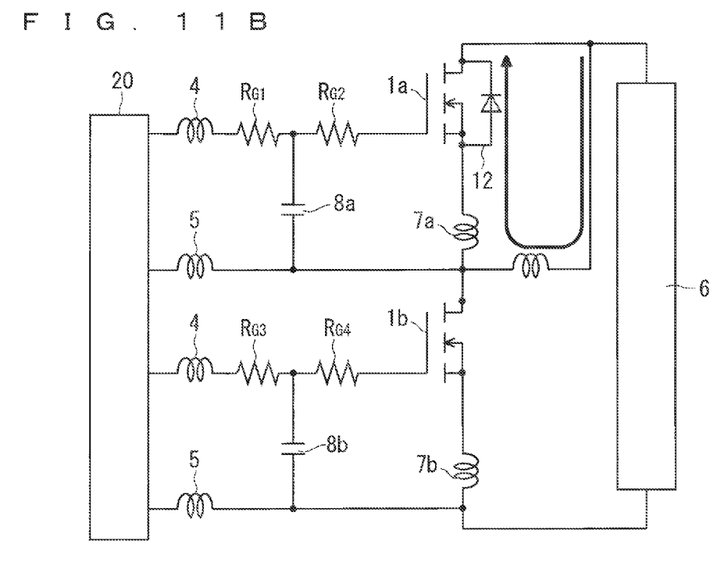

Next, with reference to FIG. 11B, an operation in a case where the opposite arm is in the off-state (in other words, the switching element 1a is in the off-state) and the switching element 1b turns off will be described. A drain current flowing into the switching element 1b flows into the diode 12 of the opposite arm or the parasitic diode of the switching element 1a. Since the diode 12 having high breakdown voltage is not capable of conducting rapidly, a drop occurs in a transitional forward voltage greater than direct current characteristics referred to as forward recovery. The voltage generated in the common inductor 7a drives to turn on the switching element 1a. The switching element 1a is driven to turn on and the voltage in a reverse direction decreases with an opening channel even if there is the parasitic diode, thereby reducing a transitional heat loss generated by forward recovery as the whole circuit.

<Effects>

The driving circuit 600 in the present preferred embodiment is characterized in that the plurality of driving circuits form a bridge circuit together with the plurality of switching elements 1a and 1b, and the main current circuit 6.

Therefore, in a turn-on switching, when the diode 12 of the reverse phase (opposite arm) is recovered, the reverse bias of the switching element 1a of the reverse phase increases to prevent a malfunction. In a turn-off switching, the switching element 1a of the reverse phase turns on by forward bias to form a path for passing current in parallel to the diode 12, thereby reducing forward recovery.

Seventh Preferred Embodiment

Configuration

Figure 12:
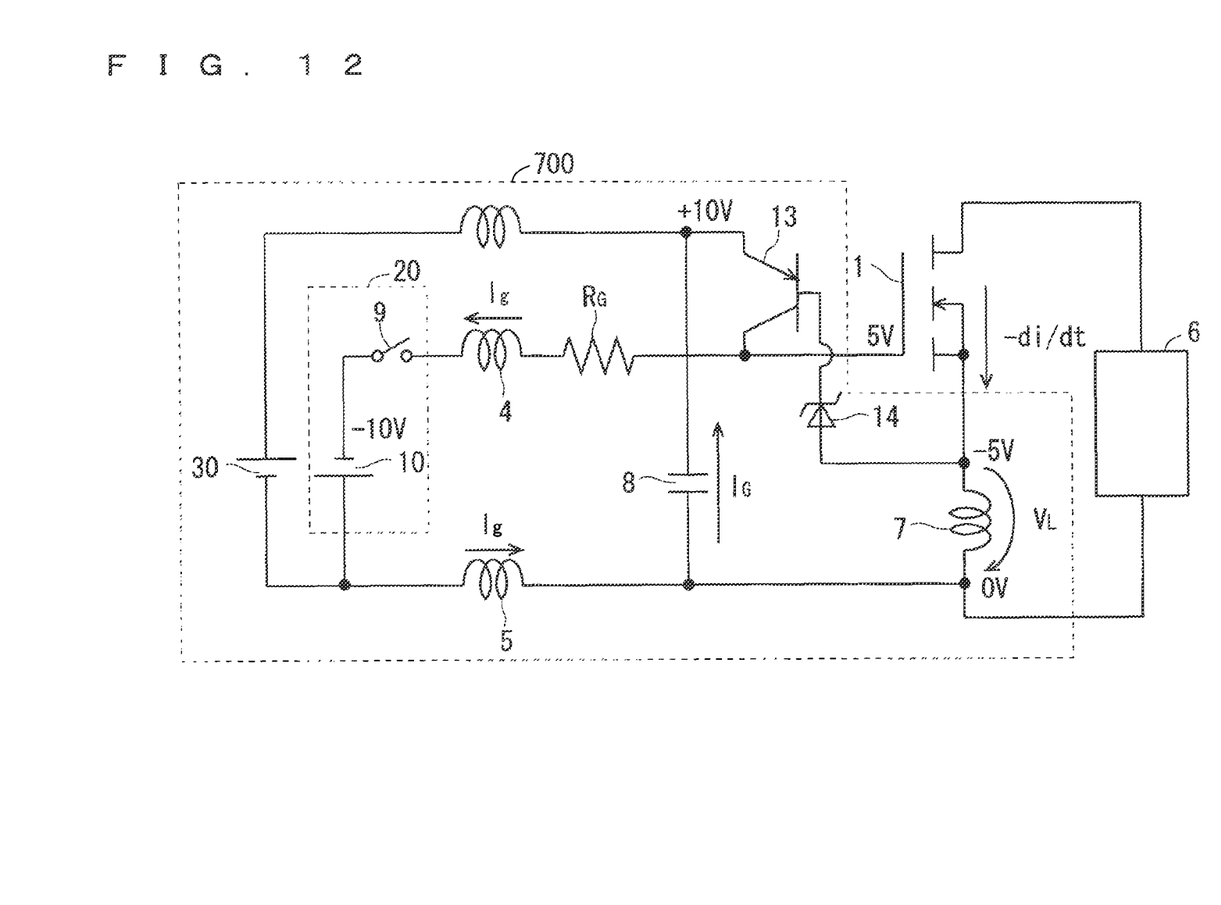
FIG. 12 is a diagram showing a configuration of a driving circuit according to a seventh preferred embodiment.

FIG. 12 shows a configuration of a driving circuit 700 in the present preferred embodiment. In the first preferred embodiment (FIG. 1), the capacitor 8 is further provided for the negative feedback by the common inductor 7 to effectively function. In this case, the capacitor 8 needs to charge and discharge even in a period except for the negative feedback timing, thereby increasing a driving power. The driving circuit 700 in the present preferred embodiment reduces an increase in the driving power.

As shown in FIG. 12, the driving circuit 700 in the present preferred embodiment is different from the driving circuit 100 (FIG. 1) of the first preferred embodiment as follows. The driving circuit 700 further includes a DC power supply 30, and the DC power supply 30 has a voltage (for example, 10 V) greater than the on-voltage of a switching element 1 (for example, 5 V). A negative side of the DC power supply 30 is connected to a potential on a source side of the switching element 1. One end of a capacitor 8 is connected to a positive side of the DC power supply 30 instead of a gate side of the switching element 1.

The driving circuit 700 further includes a switching element 13 for capacitor. The switching element 13 for capacitor is connected between the gate side of the switching element 1 and one of the ends of the capacitor 8. The switching element 13 for capacitor turns on only when the common inductor 7 generates the negative feedback voltage.

In the present preferred embodiment, for example, a zener diode 14 is used to turn on the switching element 13 for capacitor only when the common inductor 7 generates the negative feedback voltage. A cathode of the zener diode 14 is connected to the gate of the switching element 13 for capacitor. An anode of the zener diode 14 is connected between the source of the switching element 1 and the common inductor 7.

<Operation>

While the switching element 1 turns on, the DC power supply 30 charges the capacitor 8. When the switching element 1 turns off, the negative feedback voltage of the common inductor 7 is applied to the zener diode 14 to turn on the switching element 13 for capacitor. Thus, the capacitor 8 is capable of discharging to a driving inductance 4.

<Effects>

The driving circuit 700 in the present preferred embodiment is characterized as follows. It further includes the DC power supply 30 having the voltage greater than the on-voltage of the switching element 1. The negative side of the DC power supply 30 is connected to the potential on the source side of the switching element 1. One of the ends of the capacitor 8 is connected to the positive side of the DC power supply 30 instead of the gate side of the switching element 1. The driving circuit 700 further includes the switching element 13 for capacitor. The switching element 13 for capacitor is connected between the gate side of the switching element 1 and one of the ends of the capacitor 8 and it turns on only when the common inductor 7 generates the negative feedback voltage.

Therefore, the switching element 13 for capacitor turns on only when the common inductor 7 generates the negative feedback voltage, so that the capacitor 8 discharges only when the switching element 1 turns off, whereby the driving power of the driving circuit 700 can be reduced in addition to the effects as described in the first preferred embodiment.

Eighth Preferred Embodiment

A semiconductor device in the present preferred embodiment includes the driving circuit 100 in the first preferred embodiment (FIG. 1) and a switching element 1. The switching element 1 is disposed in a power module and a capacitor 8 is disposed in the same power module.

Figure 13A:
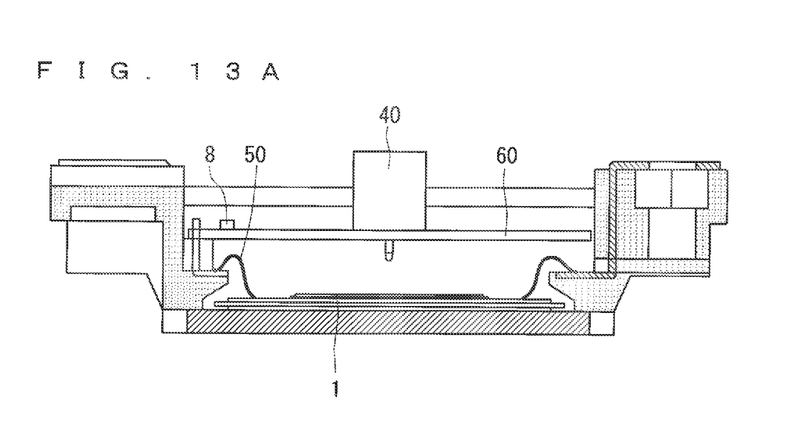
FIGS. 13A and 13B are diagrams showing a configuration of a power module according to a eighth preferred embodiment.
Figure 13B:
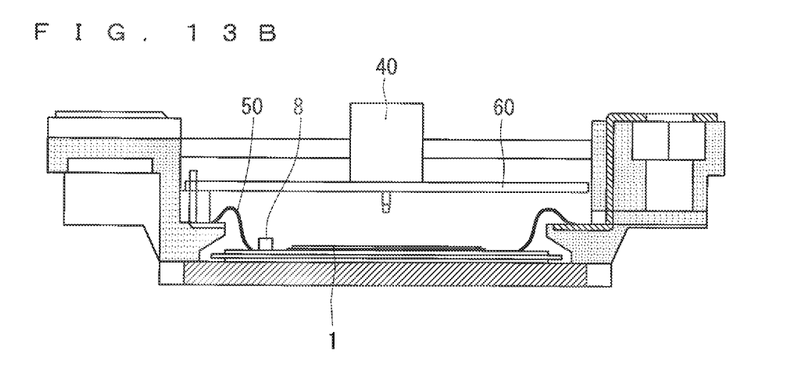

FIG. 13A shows an example of the power module. The switching element 1 is disposed through an insulating layer on a base plate made of copper and the like of the power module. The switching element 1 and a printed wiring board 60 are connected through a wire 50, and the capacitor 8 is disposed on the printed wiring board 60. An external connection socket 40 is disposed on the printed wiring board 60. As shown in FIG. 13B, the switching element 1 and the capacitor 8 may be disposed on the same substrate. The capacitor 8 is, for example, a surface-mounting capacitor.

In the driving circuit 100 of the first preferred embodiment, the capacitor 8 prevents the driving inductances 4 and 5 from interfering with the negative feedback operation of the common inductor 7. As an interconnection between the capacitor 8 and the common inductor 7 has less driving inductance, the effect is greater. Therefore, as the capacitor 8 is disposed closer to the switching element 1 (MOSFET), the effect is greater. Thus, the capacitor 8 is built in the power module, whereby a greater effect can be obtained.

<Effects>

The semiconductor device in the present preferred embodiment is characterized in that the switching element 1 is disposed in the power module, and the capacitor 8 is disposed in the power module.

Therefore, the capacitor 8 is disposed in the power module, in which the switching element 1 is disposed, to reduce an inductance of an interconnection between the capacitor 8 and the switching element 1. Thus, the capacitor 8 can suppress an effect of the driving inductances 4 and 5 more effectively.

Ninth Preferred Embodiment

A semiconductor device in the present preferred embodiment includes the driving circuits 100, 200, 300, 400, 500, 500A, 600, and 700 in any of the preferred embodiments 1 to 8, and a switching element. In the preferred embodiments 1 to 8, a MOSFET is used as a switching element, and a likelihood of voltage fluctuation is required more in the application of large current, whereby a high breakdown voltage switch is suitable. Therefore, using a switching element formed of a wide bandgap semiconductor represented by a SiC exerts the greatest effect.

The driving circuit as described in the preferred embodiments 1 to 8 is applicable as long as it is "a switch showing a change in the amount of a switch current corresponding to a control voltage in a sufficient speed for changing di/dt in di/dt changing period of current for a switch". Particularly, in the application of large current, since a likelihood of voltage fluctuation is required more, a high breakdown voltage switch is suitable. Therefore, the high breakdown voltage switch is combined with a switching element 1 formed of a wide bandgap semiconductor represented by a SiC to exert the greatest effect.

In general, a wide bandgap semiconductor has a tendency that it is difficult to obtain channel conduction characteristics from $V_{GS}$ because of a parasitic level generated in a boundary surface between an insulating film achieved by an oxide and the wide bandgap semiconductor. In other words, there is a tendency that the amount of change in a drain current to change in $V_{GS}$ is smaller than that in a case of using silicon. For this reason, the negative feedback is hardly generated, and this problem can be improved by combining the wide bandgap semiconductor with the driving circuit as described in the preferred embodiments 1 to 8.

<Effects>

The semiconductor device in the present preferred embodiment is characterized in that a switching element includes a wide bandgap semiconductor.

Therefore, the switching element is formed of the wide bandgap semiconductor, so that it can be applicable to the use of higher breakdown voltage large current. The wide bandgap semiconductor can generate negative feedback while suppressing a surge voltage and lowering losses by being combined with the driving circuit as described in the preferred embodiments 1 to 8.

<Conclusion>

A driving circuit of the present invention (for example, a driving circuit 100) is characterized in that a common inductor 7 is disposed to obtain negative feedback, and a capacitor 8 is connected to a gate and a source of a MOSFET in an area without including the common inductor 7.

The capacitor 8 plays a role of immediately supplying a charging/discharging current to a parasitic capacitance between the gate and the source of the MOSFET when the voltage of two ends of the common inductor 7 is momentarily on the increase by di/dt.

Thus, the voltage generated at two ends of the common inductor 7 can be effectively applied to the source to occur a negative feedback operation. Moreover, after the negative feedback is not required, the capacitor 8 discharges to rapidly charge between the gate and the source, thereby preventing a delay in decreasing on-voltage.

Because of the effects as described above, although the driving inductances 4 and 5 are great enough to have a dominant influence on the common inductor 7, a current change speed in a latter half of a turn-off switching can be suppressed without decreasing a voltage change speed in a first half of the turn-off switching, and also subsequently the on-voltage can be decreased without delay, whereby di/dt can be suppressed to a minimum increase in losses during turn-off.

According to the driving circuit in the present invention (for example, the driving circuit 100), the capacitor 8 is added for the negative feedback due to the voltage generated by the common inductor 7, and thus with almost no change in current of the driving inductances 4 and 5 and with almost no change in the voltage of two ends of a gate resistance $R_G$, a discharging current from an input capacitance 11 can be reduced and di/dt during the turn-off can be effectively reduced by the minimum common inductor 7.

Moreover, the driving inductances 4 and 5 caused by the amount of the negative feedback has no upper limit and the upper limit value of the driving inductances 4 and 5 is greatly increased.

Furthermore, according to the driving circuit 200, the ratio of the gate resistance $R_{G1}$ to the gate resistance $R_{G2}$ can adjust the amount of the negative feedback, thereby facilitating fine adjustments of the amount of the negative feedback.

The driving circuit of the present invention (for example, the driving circuit 100) can selectively suppress only di/dt, thereby having the effect of suppressing a vibration waveform during switching including turn-on and having the effect of easily protecting a short circuit by suppressing an increasing speed of the short circuit when the short circuit is generated.

When the driving circuit of the present invention (for example, the driving circuit 100) is combined with a switching element 1 formed of a wide bandgap semiconductor in which the negative feedback is hardly generated, the disadvantage can be reduced.

In the present invention, switching elements 1, 1a, and 1b are MOSFETs for convenience of descriptions, and as described in the beginning, the switching elements 1, 1a, and 1b are "a semiconductor switch group represented by a MOSFET". In other words, any switches that show a change in current of a switch corresponding to a control voltage in a sufficient speed for changing di/dt in di/dt changing period may be exploited.

Moreover, the common inductor 7 may be any impedance as long as it gives the amount of the negative feedback to di/dt even if it is not a pure impedance.

Furthermore, the switching elements 1, 1a, and 1b may not be connected in series. For example, the case where they are connected in series as shown in FIG. 6 will be described. As for the connection between the source side of the driving circuit 300 and the main current circuit 6, the source side of the driving circuit 300 may be connected to the main current circuit 6 at one point as shown in FIG. 6. In other words, the source side of the switching element 1a is once connected to the source side of the switching element 1b, and the source side of the switching element 1b is connected to the main current circuit 6 at one point. The driving circuit 300 and the main current circuit 6 may be connected at the positions equivalent from the positions of the switching elements 1a and 1b. In this case, the source side of the driving circuit 300 and the main current circuit 6 are connected at plural points (two points). To avoid a loop current generated by a loop circuit, a connection at one point has an advantage. On the other hand, connecting at plural points facilitates the adjustment of a self-impedance of a connection.

A numerical value used in a description of a preferred embodiment in the specification is an example and does not limit the present invention. A numerical value without a remainder is selectively used for convenience of descriptions, and it is not necessarily an optimum value for a specific application.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A driving circuit that drives at least one switching element connected to a main current circuit, said driving circuit comprising:
   a driving portion applying on/off-voltage to a gate of said at least one switching element;
   a common inductor disposed in an interconnection part commonly connected to said driving portion and a source side of said at least one switching element in a loop formed of said main current circuit and said at least one switching element; and
   at least one capacitor electrically connected between said gate side and said source side on said driving portion side with respect to said common inductor, regardless of turning on/off of said at least one switching element, wherein
   with turning off the switching element, a driving inductance is supplied with current discharged by the capacitor to apply a negative feedback voltage of the common inductor between said gate side and said source side.

2. The driving circuit according to claim 1, wherein
   said plurality of switching elements are connected in parallel to said main current circuit, and
   said plurality of common inductors and said plurality of capacitors are each provided for said plurality of switching elements.

3. The driving circuit according to claim 2, wherein said driving circuit includes at least one capacitor among said plurality of capacitors that is disposed closest to said driving portion, instead of including said capacitors for each of said plurality of switching elements.

4. The driving circuit according to claim 1, further comprising:
   a DC power supply, wherein
      said DC power supply has voltage greater than on-voltage of said at least one switching element,
      a negative side of said DC power supply is connected to a potential on a source side of said at least one switching element, and
      one end of said at least one capacitor is connected to a positive side of said DC power supply instead of the gate side of said at least one switching element; and
   a switching element for capacitor, wherein
      said switching element for capacitor is connected between the gate side of said at least one switching element and said one end of said at least one capacitor, and
      said switching element for capacitor turns on only when said common inductor generates negative feedback voltage.

5. The driving circuit according to claim 1, further comprising a plurality of driving current limiting portions on the gate side of said at least one switching element, wherein
   said plurality of driving current limiting portions are connected in series, and
   one end of said at least one capacitor is connected between said plurality of driving current limiting portions.

6. A driving circuit that drives a plurality of switching elements to be connected to a main current circuit, said plurality of switching elements being connected in series, comprising:
   a plurality of said driving circuits according to claim 1 for said plurality of switching elements.

7. A driving circuit that drives a plurality of switching elements to be connected to a main current circuit, said plurality of switching elements being connected in series, comprising:
   a plurality of said driving circuits according to claim 5 for said plurality of switching elements.

8. The driving circuit according to claim 6, wherein said plurality of driving circuits form a bridge circuit together with said plurality of switching elements and said main current circuit.

9. The driving circuit according to claim 7, wherein said plurality of driving circuits form a bridge circuit together with said plurality of switching elements and said main current circuit.

10. A semiconductor device, comprising:
    at least one switching element to be connected to a main current circuit; and
    said driving circuit according to claim 1.

11. The semiconductor device according to claim 10, wherein said at least one switching element includes a wide bandgap semiconductor.

12. The semiconductor device according to claim 10, wherein
   said at least one switching element is disposed in a power module, and
   said at least one capacitor is disposed in said power module.

13. The semiconductor device according to claim 11, wherein
   said at least one switching element is disposed in a power module, and
   said at least one capacitor is disposed in said power module.

14. The driving circuit according to claim 1, wherein
   said common inductor is commonly connected to a gate charge or discharge current loop formed of said driving portion and said as least one switching element as well as a main current loop formed of said main current circuit and said at least one switching element.

* * * * *